United States Patent [19]

Mayer et al.

[11] Patent Number: 5,652,471
[45] Date of Patent: Jul. 29, 1997

[54] RECTIFIER ARRANGEMENT, ESPECIALLY FOR A THREE-PHASE GENERATOR FOR A MOTOR VEHICLE

[75] Inventors: Rolf Mayer, Winnenden; Arno Altpeter, Sindelfingen; Joerg Streller, Affalterbach; Manfred Roessler, Stuttgart; Vesna Biallas, Reutlingen; Henning Stilke, Llantwit; Godehard Schmitz, Sersheim; Rainer Brachert, Freudental; Thomas Richard, Heilbronn; Siegfried Schuler, Engstingen; Holger Haussmann, Metzingen, all of Germany

[73] Assignee: Robert Bosch GmbH, Stuttgart, Germany

[21] Appl. No.: 489,964

[22] Filed: Jun. 13, 1995

[30] Foreign Application Priority Data

Jun. 18, 1994 [DE] Germany ................... 44 21 358.1

[51] Int. Cl.⁶ .................................................. H02K 11/00
[52] U.S. Cl. ..................... 310/68 D; 310/66; 310/68 R; 363/141
[58] Field of Search .................... 310/68 D; 363/141, 363/145; 439/66

[56] References Cited

U.S. PATENT DOCUMENTS

| | | | |
|---|---|---|---|
| 3,916,435 | 10/1975 | Camplin et al. | 357/79 |
| 3,959,676 | 5/1976 | Striker | 310/68 D |
| 3,979,659 | 9/1976 | Lynch et al. | 310/68 D |
| 4,232,238 | 11/1980 | Saito et al. | 310/68 D |
| 4,583,005 | 4/1986 | Bevans | 310/68 D |
| 4,604,538 | 8/1986 | Merrill et al. | 310/68 D |
| 4,835,427 | 5/1989 | Boehm et al. | 310/68 D |
| 4,952,829 | 8/1990 | Armbruster et al. | 310/68 D |
| 5,152,695 | 10/1992 | Grabbe et al. | 439/66 |
| 5,296,770 | 3/1994 | Pflueger et al. | |
| 5,427,535 | 6/1995 | Sinclair | 439/66 |
| 5,462,440 | 10/1995 | Rothenberger | 439/66 |

FOREIGN PATENT DOCUMENTS

| | | |
|---|---|---|
| 0141990 | 9/1984 | European Pat. Off. . |
| WO91/20119 | 12/1991 | European Pat. Off. . |
| 4018710 | 12/1991 | Germany . |
| 4042996 | 2/1992 | Japan . |
| 906434 | 9/1962 | United Kingdom . |

Primary Examiner—Thomas M. Dougherty
Assistant Examiner—Burton S. Mullins
Attorney, Agent, or Firm—Michael J. Striker

[57] ABSTRACT

The rectifier arrangement, preferably for a three-phase generator for a motor vehicle, has at least one power diode of positive polarity and at least one power diode of negative polarity assigned to respective half waves of each phase of the three-phase current and a cooling arrangement for the power diodes, the power diodes of like polarity being arranged on respective heat sinks in an electrically and thermally conductive fashion, and the heat sinks being sandwiched together with at least one electrically insulating part (32) which contains the electrical conductors between the diodes and the three-phase winding. The electrically conductive connections of the power diodes (12, 14) of positive and negative polarity to the phases (U, V, W) of the three-phase generator extend within the electrically insulating part (32) so that electrical contact is made with the power diodes (12, 14) of positive and negative polarities in respective cavities (40, 44) in the insulating part (32) via in each case one spring element. A punched grid (34) for each of the phases (U, V, W) extends in the cavities and includes conductor tracks (50) and spring elements (48, 49) for making electrical contact between pairs of power diodes of opposite polarity and each phase.

15 Claims, 7 Drawing Sheets

RECTIFIER ARRANGEMENT, ESPECIALLY FOR A THREE-PHASE GENERATOR FOR A MOTOR VEHICLE

BACKGROUND OF THE INVENTION

The present invention relates to a rectifier arrangement, and, more particularly, to a rectifier arrangement for a three-phase generator for a motor vehicle.

Rectifier arrangements for three-phase generators are known. If the three-phase generators are used, for example, to supply the electrical system in motor vehicles, the three-phase alternating current generated in the three-phase generators must be rectified because of the battery charging required in the motor vehicle. For this purpose, semiconductor power diodes are provided which are interconnected in a three-phase bridge connection. In this case, each half wave of each phase is assigned one diode, with the result that for full-wave rectification the three-phase bridge connection is formed from a total of six power diodes (see DE 40 18 710 A1, corresponding to U.S. Pat. No. 5,296,770). In this case, three positive diodes are connected for the positive side and three negative diodes for the negative side. It is known for the power diodes to be constructed as press-fit diodes, power diodes of like polarity respectively being pressed into one heat sink. The heat sinks are in this case sandwiched together, having an interposed insulating part which receives the electrical connections between the power diodes and the three-phase winding. A press-fit base of the press-fit diodes simultaneously undertakes in this case permanent thermal and electrical connection of the power diodes to the heat sink. However, it is possible to produce such a three-phase bridge connection comprising press-fit diodes only with a very high outlay. Furthermore, it is necessary there to have crimp connections welded or soldered to the terminals, in order to absorb thermal and mechanical stresses at the soldering or welding points.

SUMMARY OF THE INVENTION

According to the invention, the rectifier arrangement, especially for the three phase generator of a motor vehicle, includes at least one power diode of positive polarity and at least one power diode of negative polarity assigned to respective half-waves of each of three phases (U, V, W) of a three-phase current; a cooling arrangement for the power diodes including heat sinks, the power diodes of like polarity being arranged on respective heat sinks in an electrically and thermally conductive manner; at least one electrically insulating part assembled with the heat sinks and accommodating electrical connections between the at least one power diodes of positive and negative polarities and the three phases (U, V, W), and an electrically conductive connection of the at least one positive power diode and the at least one negative power diode of each of the three phases (U, V, W) which extends in the at least one electrically insulating part to one of the three phases (U, V, W) and includes spring elements making electrical contact with respective power diodes of positive and negative polarity outside the insulating part.

The rectifier arrangement according to the invention renders it possible, by contrast, to produce the rectifier arrangement simply and cost effectively and largely to minimize fatigue phenomena of the thermally and electrically conductive terminal connections of the rectifier arrangement during operation. Because the power diodes are constructed as diode chips which are connected in a planar fashion to the heat sink, and that an electrically conductive connection is produced between the power diodes and the phases of the three-phase current via a spring element in each case, there is on the one hand a simple design of the overall rectifier arrangement, which can be produced with a reduced manufacturing outlay and thus in a cost effective fashion. In addition, the rectifier arrangement can be constructed very robustly, with the result that there is a high reliability against mechanical, thermal and chemical fatigue even in the event of high loading.

In a preferred embodiment of the rectifier arrangement each of the spring elements is a meandering spring having a soft characteristic. Each of the phases (U, V, W) is advantageously assigned a pair of the meandering springs making electrical contact with respective positive and negative power diodes. The electrically conductive connection can be formed by a conductor track, the spring elements and the connected conductor track for each phase (U, V, W) can be each formed as part of a punched grid; and each punched grid can be sheathed, advantageously injection coated, with an insulating material except at regions of each of the punched grid including the spring elements and a terminal connection for each of the phases (U, V, W). The at least one electrically insulating part advantageously consists of the punched grid and the insulating material.

In other preferred embodiments of the rectifier arrangement the at least one electrically insulating part is arranged between heat sinks so that in the region of the at least one power diodes of positive and negative polarity the at least one electrically insulating part is provided with respective cutouts forming respective cavities in which the respective meandering springs are arranged.

Advantageously the at least one electrically insulating part has at least one slot connected via at least one channel in the heat sink to at least one of the cavities. A sealing compound can be provided in the slots and the cavities to reduce thermal, mechanical and chemical fatigue of the spring elements. The sealing compound can be provided with embedded elastic regions, including air-filled balloons and/or foam to improve their effectiveness.

BRIEF DESCRIPTION OF THE DRAWING

The objects, features and advantages of the present invention will now be illustrated in more detail by the following detailed description, reference being made to the accompanying drawing in which:

FIG. 7 (*b*) is a rear view of a positive heat sink;

FIG. 8 (*b*) is a rear view of a negative heat sink; and

DESCRIPTION OF THE PREFERRED EMBODIMENTS

Figure 1:
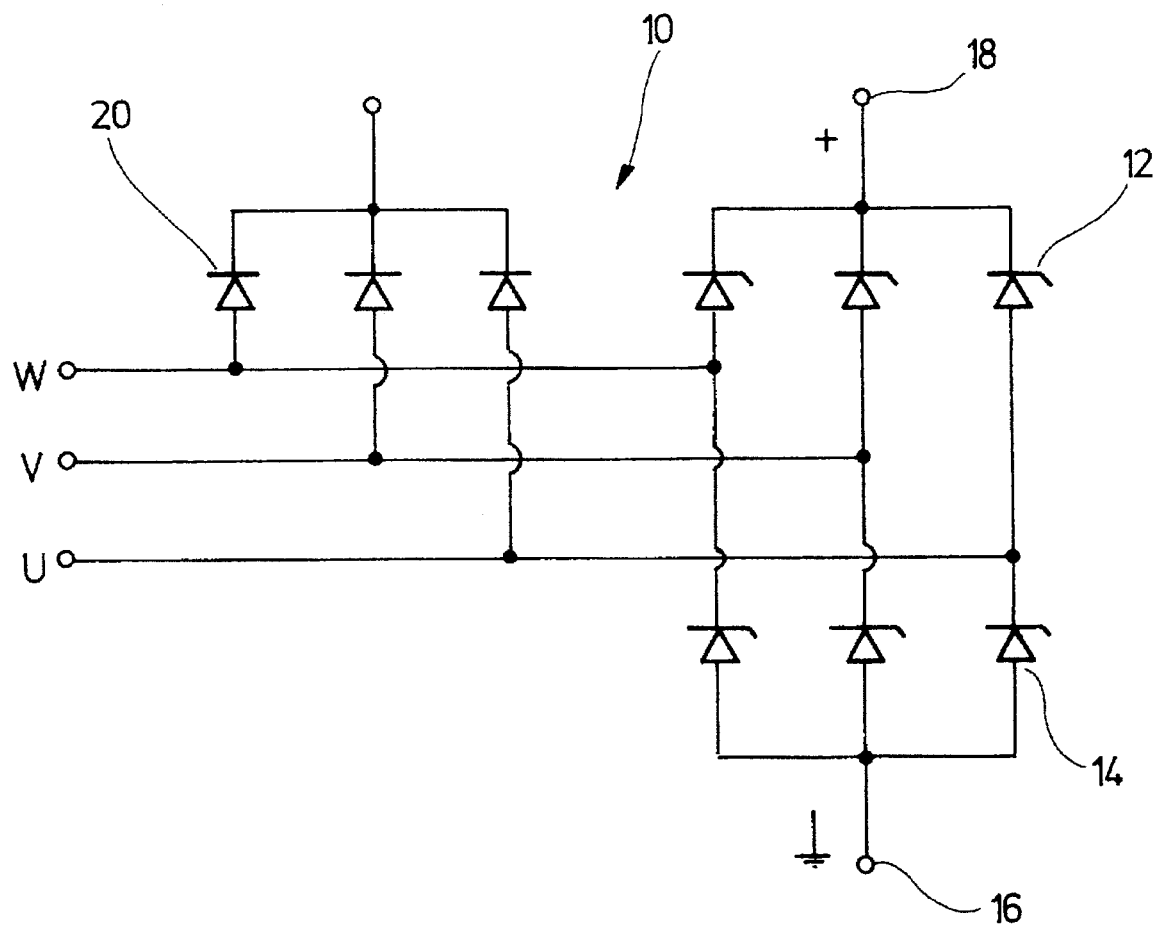
FIG. 1 is an electric circuit diagram of a rectifier arrangement as a three-phase bridge connection.

The electrical diagram of a rectifier arrangement for a three-phase generator is shown in FIG. 1. The phases U, V, W of the stator winding of the three-phase generator (not represented) are connected to a three-phase bridge connection 10, each phase being connected to a positive diode 12 and a negative diode 14. The anodes of the negative diodes 14 are connected to a supply terminal 16 and the cathodes of the positive diodes 12 are connected to a supply terminal 18. The supply terminals 16 and 18 are connected via counters (not represented here) to electric consumers in motor vehicles and to a motor vehicle battery (likewise not represented). Furthermore, each phase U, V, W is connected to an excitation diode 20 whose interconnected cathodes lead via sliprings to an excitation winding (not represented) in the rotor of the three-phase generator. Each of the positive diodes 12 and negative diodes 14 passes a half wave of the single-phase alternating current in the phase to which they are connected. The positive diodes 12 allow the positive half waves to pass and the negative diodes 14 the negative half waves. As a result, a lightly undulating direct current is produced by the three-phase alternating current of the three-phase generator. Lost heat which must be dissipated in a suitable way is produced in this case in the diodes 12 and 14 during operation of the generator.

Figure 2:
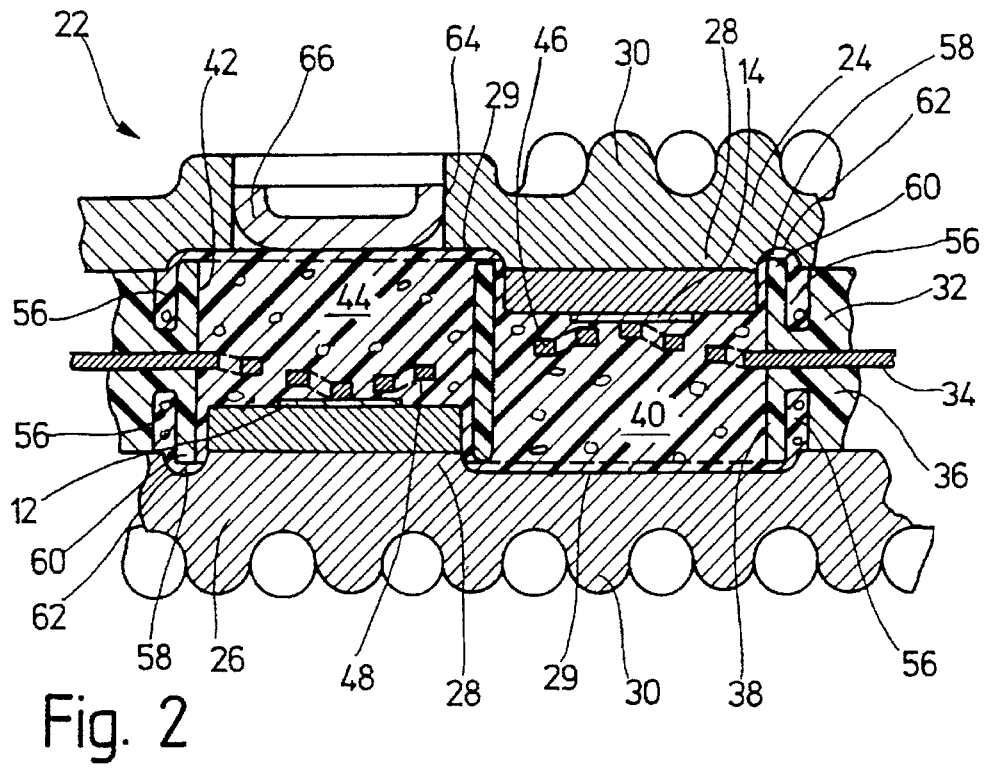
FIG. 2 is a cross-sectional view through a region of a finally assembled rectifier arrangement.

FIG. 2 shows a sectional representation through a subregion of a finally assembled rectifier arrangement, designated here in general by 22. The aim is to explain the basic idea of the present invention with the aid of FIG. 2. A negative diode 14 and a positive diode 12 of the three-phase bridge connection 10 are shown, the particular design of which is explained in more detail with the aid of FIGS. 4 and 5. The negative diode 14 is arranged in a thermally and electrically conductive fashion on a negative heat sink 24. The positive diode 12 is arranged in a likewise thermally and electrically conductive fashion on a positive heat sink 26. For this purpose, the heat sinks 24 and 26 have, for example, platform-like projections 28 on which the diodes 12 and 14, respectively are, for example, soldered. The projections 28 can be formed, for example, by appropriate depressions 29 in the heat sinks 24 and 26, respectively. As indicated in FIG. 2, in order to enlarge the effective cooling surface the heat sinks 24 and 26 can have cooling studs 30 on their outer surfaces.

A connection plate 32 is arranged between heat sinks 24 and 26, thus resulting overall in a sandwich-type design of the rectifier arrangement 22, specifically composed of the negative heat sink 24, the connection plate 32 and the positive heat sink 26. The connection plate 32 has a punched grid 34 (still to be explained), which is sheathed by an insulating material 36 in part, i.e. with the exception of connection and spring regions. The insulating material 36 prevents an electrically conductive connection between the negative heat sink 24 and the positive heat sink 26, on the one hand, and between the punched grid 34 and the heat sinks 24 and 26, respectively, on the other hand. In the region of the negative diode 14, the connection plate 32 has a continuous cutout 38, with the result that a cavity 40 is produced here. In the region of the positive diode 12, the connection plate 32 has a further continuous cutout 42, with the result that a cavity 44 is produced here.

Inside the cavities 40 and 44, the punched grid 34 forms in each case a meandering spring 46 and 48, respectively. The spring 46 is preloaded in this case in such a way that it contacts the negative diode 14, and the spring 48 is preloaded in such a way that it contacts the positive diode 12. The contact between the spring 46 or 48, respectively, and the diodes 14 and 12, respectively, can take place either exclusively by a spring force in accordance with the preloading of the springs 46 and 48, or the latter are additionally soldered or welded, for example, to the diodes 14 and 12, respectively. In addition to the springs 46 and 48, the punched grid 34 further forms conductor tracks 50 (FIG. 3) which are provided with a supply terminal 52 to which one of the phases U, V or W of the three-phase generator can be connected. The segment shown in FIG. 2 of the rectifier arrangement thus forms the arrangement for rectifying one of the phases of the three-phase alternating current of the three-phase generator. The entire rectifier arrangement 22 therefore has a total of three of the regions shown in FIG. 2 which are constructed in a fully analogous fashion.

Figure 3:
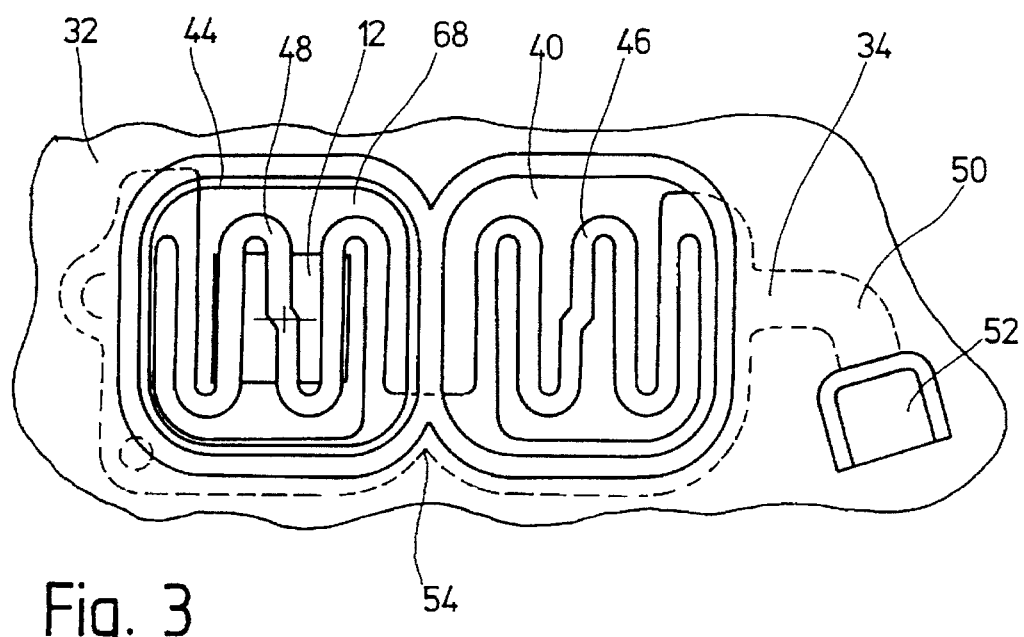
FIG. 3 is a top view of a rectifier arrangement in accordance with FIG. 2.

It becomes clear with the aid of FIG. 3 that the punched grid 34 for one phase respectively comprises the springs 46 and 48, at least one conductor track 50, a supply terminal 52 and the regions 54 connecting the springs 46 and 48 to one another. The punched grid 34 can, for example, be punched out of a plate-shaped material available in an appropriate size, with the result that the above-mentioned individual structures are produced. After punching has been performed, the springs 46 and 48, respectively, are correspondingly plastically deformed, thus producing preloading of the springs 46 and 48, respectively, in the direction of the negative diode 14 or the positive diode 12, respectively. The springs 46 and 48 respectively, have a characteristic which is as soft as possible, with the result that after the assembly of the connection plate 32 a continuous pressure is exerted on the diodes 14 and 12, respectively. The punched grids required for each phase U, V, W are sheathed with the insulating material 36 before assembly, thus producing the connection plate 32. Thus, overall the connection plate 32 has the punched grids 34 of the respective phases U, V and W. The punched grids 34 consist, for example, of pure copper or higher grade bronzes. In the region bordering the cavities 40 and 44, respectively, the connection plate 32 has at least one slot 56 which is respectively connected to the cavities 40 and 44 via at least one channel 58 in the heat sink 24 or 26. The regions 60 of the connection plate 32, which are respectively between the cavity 40 and one slot 56 and the cavity 44 and another slot 56 have a somewhat greater height than the entire connection plate 32. In this case, the regions 60 at least partially engage in local depressions 62 in the channels 58, around the projections 28, in the heat sinks 24 and 26, respectively. In the region of the cavity 44, the negative heat sink 24 has an assembly opening 64 which can be sealed by a cover 66.

The procedure for assembling the rectifier arrangement 22 is as follows. The individual parts of the rectifier arrangement 22 are prepared separately. Thus, the negative heat sinks 24 and positive heat sinks 26 can be shaped as desired for example by pressure die-casting and, optionally, by subsequent machining. The negative heat sink 24 can in this case advantageously be simultaneously structured as a slipring end shield for the three-phase generator, with the result that it is possible to dispense with the additional arrangement of a negative heat sink. Furthermore, the punched grids 34 are punched out in accordance with the desired contour and injection coated to the connection plate 32. After production of the connection plate 32, the springs 46 and 48 are shaped in an appropriately plastic fashion in the region of the cutouts 40, 44.

In a first assembly step, the negative diodes 14, constructed as diode chips, are fastened to the negative heat sink 24, for example by being soldered onto the above-mentioned projections 28. The positive diodes 12, likewise constructed as diode chips, are fastened in a similar way to the positive heat sink 26. The preproduced connection plate 32 is now fastened, for example riveted, to the negative heat sink 24 in a positionally oriented fashion. The positional orientation of the connection plate 32 is performed such that the regions 60 of the connection plate 32 engage at least partially in the depressions 62 of the negative heat sink 24. Because of the assembly of the connection plate 32, the spring 46 presses by virtue of its preloading against the negative diode 14, with the result that a sufficiently large contact pressure is produced in accordance with the selected preloading. The spring 46 can additionally be soldered or welded to the negative diodes 14. This can be performed, for example, by means of a laser.

In the next step, the positive heat sink 26 is fastened, for example screwed, in a positionally oriented fashion to the assembly composed of the negative heat sink 24 and the connection plate 32. As a result, the positive diodes 12 come to be situated in the cavity 44 and press against the preloaded spring 48, thus producing a sufficiently high contact pressure between the positive diodes 12 and the springs 48. The springs 48 can likewise additionally be soldered to the positive diodes 12. This purpose is served by the assembly opening 64 in the negative heat sink 24, through which the spring 48 can make appropriate contact with the positive diode 12. After contact has been made, the assembly opening 64 is sealed in an airtight fashion by the cover 66. A continuous contact pressure is maintained on the diodes 14 and 12, respectively, during operation of the rectifier arrangement 22 by the preloading of the springs 46 and 48.

In the next step, the remaining cavities 40 and 44 are sealed or packed with foam material. A sealing compound is, for example, pressed under pressure into the previously evacuated cavities and thereby reliably fills up the latter. As an alternative to this, the sealing compound or foam packing compound can also be filled into the cavities 40 and 44 before the cover 66 is placed on. The effect of this vacuum pressure die-casting is to avoid vibration of the springs 46 and 48, on the one hand, as well as to avoid the ingress of moisture to the diodes 14 and 12, respectively, or to their contact regions. The sealing compound likewise reaches the slots 56 via the channels 58. The result is to achieve a reliable force-closed joint between the heat sinks 24 and 26, respectively, and the connection plate 32. Because the regions 60 of the connection plate 32 engage in the depressions 62 of the heat sinks 24 and 26, respectively, it is guaranteed in the event of a particularly high loading of the rectifier arrangement 22, such as can occur, for example, during operation of a motor vehicle, and that the rectifier arrangement 22 is arranged directly on a three-phase generator of the motor vehicle, that the sealing compound is essentially subjected only to a shear stress, i.e. as seen at right angles to the connection plate 32. A peeling stress occurring horizontally relative to each connection plate 32 is thus largely avoided. Reliability of contact is thereby provided between the diodes 14 and 12, respectively, and the springs 46 and 48, respectively.

For the purpose of further increasing the reliability of contact of the diodes 14 and 12, respectively, elastic regions, for example air-filled balloons, can be cast in the sealing compound. This renders it possible, first and foremost, to compensate for a thermal expansion response of the sealing compound because of the changing temperatures which occur during operation. If a soft sealing compound is used as the sealing compound, the former can be kept permanently under hydrostatic compressive stress such that a sufficiently strong adhesion of the sealing compound and the seal of the cavities is provided at any time even when relative changes in the positions of the heat sinks 24 and 26 and the connection plate 32 relative to one another occur during operation of the rectifier arrangement 22.

FIG. 3 represents in a plan view the region of the rectifier arrangement 22 which is shown in FIG. 2, the negative heat sink 24 and the negative diode 14 as well as the slots 56 not being shown. It becomes clear, in particular, that the punched grid, which is represented here in a partially dashed fashion and cast into the connection plate 32, consists of the meandering springs 46 and 48, the conductor track 50, the supply terminal 52 and the connecting regions 54, which likewise serve as conductor track. Because of the meandering course of the springs 46 and 48, the latter having as soft a characteristic as possible, it is possible to achieve preloading of the springs 46 and 48 which is sufficient for the contact pressure inside the space available in the cavities 42 and 44, respectively. It is thus possible at the same time to preload the springs 46 and 48 in opposite directions in a region in which they are situated relatively close to one another.

Figure 4:
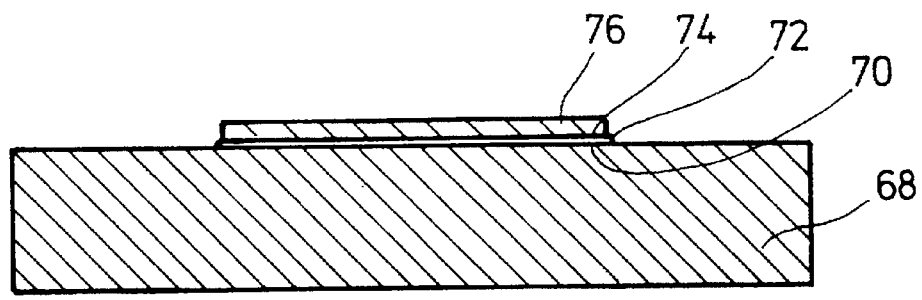
FIG. 4 is a cross-sectional view of a diode chip.
Figure 5:
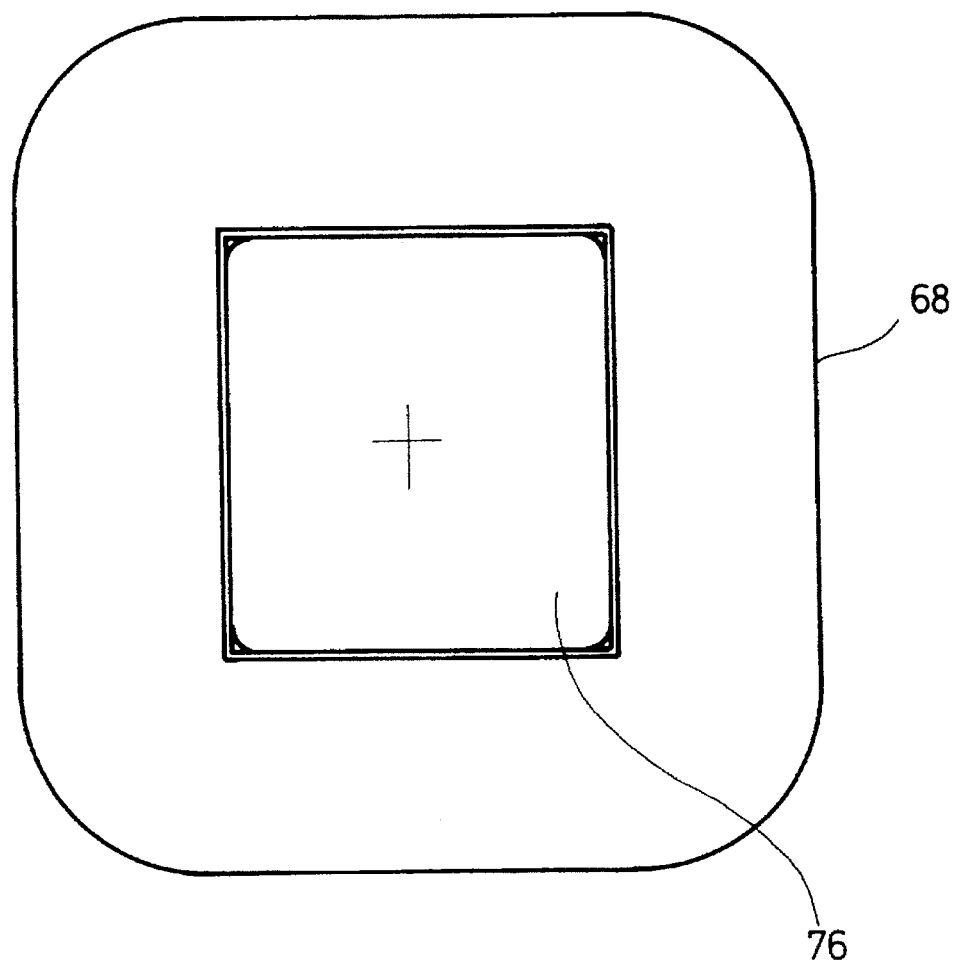
FIG. 5 is a top view of a diode chip.

The design of the diodes 12 and 14 is illustrated in FIGS. 4 and 5. The negative diode 14 is designed in principle in the same way as the positive diode 12. Only the pn junction of the diodes 12 and 14, respectively, is arranged in an appropriately laterally inverted fashion. The diodes consist of a base 68 to which a diode chip 72 is applied via a solder 70. A head plate 76 is applied to the diode chip 72 via a further solder 74. Both the base 68 and the head plate 76 consist of an electrically conductive material. The base 68 serves to fasten the diode chip 72 to the heat sinks 24 and 26, respectively. The base 68 is soldered for this purpose to the heat sinks, for example. The diode chip 72 makes contact with the springs 46 and 48, respectively, via the head plate 76. The diode chip 72 is thus simultaneously protected against excess mechanical stress due to loading of the springs 46 and 48, respectively.

Figure 6:
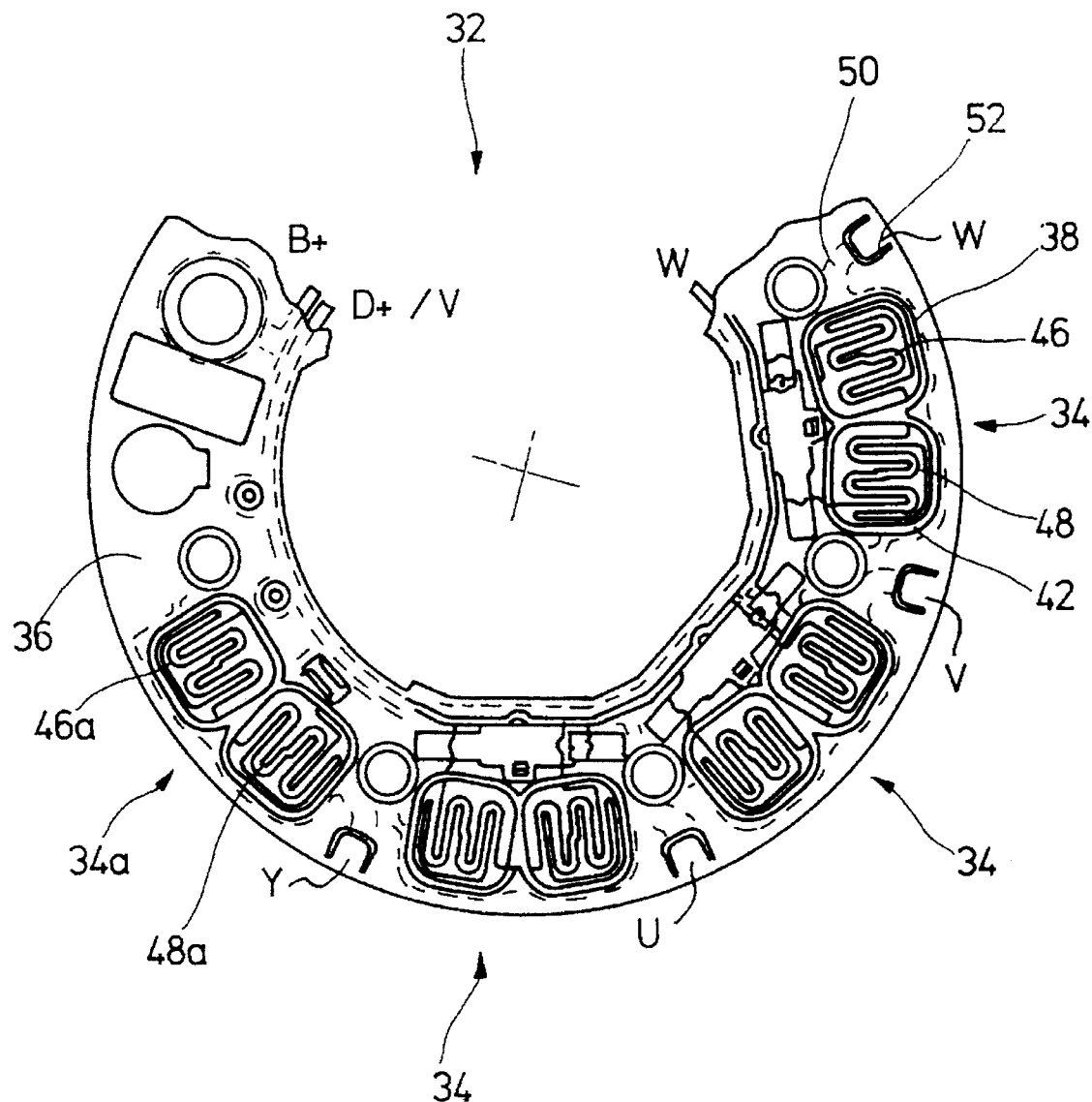
FIG. 6 is a top view of a connection plate.

FIG. 6 shows a plan view of a complete connection plate 32. It is clear that the connection plate 32 extends in an annular fashion and is thus adapted to the contour of a three-phase generator. The connection plate 32 has a total of three punched grids 34, respectively for the phases U, V and W of the three-phase generator. A further punched grid 34a can be used, for example, to rectify the current flowing via the star point Y of the phases U, V, W. The connection plate 32 thus consists overall of an insulating material 36 in which the punched grids 34 are embedded. The connection plate 32 has the above-mentioned cutouts 38 and 42, respectively, where the springs 46 and 48 are constructed. Furthermore, additional cutouts (not shown in the drawing) are provided in the connection plate 32 which are provided on the one hand for fastening means and on the other hand for tapping D+/V (controller terminal), B+ (generator terminal 18 to the consumer or to the battery), W (terminal for speed) or D (generator terminal 16) signals of the three-phase generator. The correspondingly desired connections can be provided by appropriate punchings of the punched grids 34 by appropriately different punching of the punched grids 34. The spring elements 46a and 48a, indicated here, for the additional diodes connected to the star point Y can subsequently be punched away in applications where they are not required. However, there is no intention to provide further details of the connection plate 32 in this description.

Figure 7B:
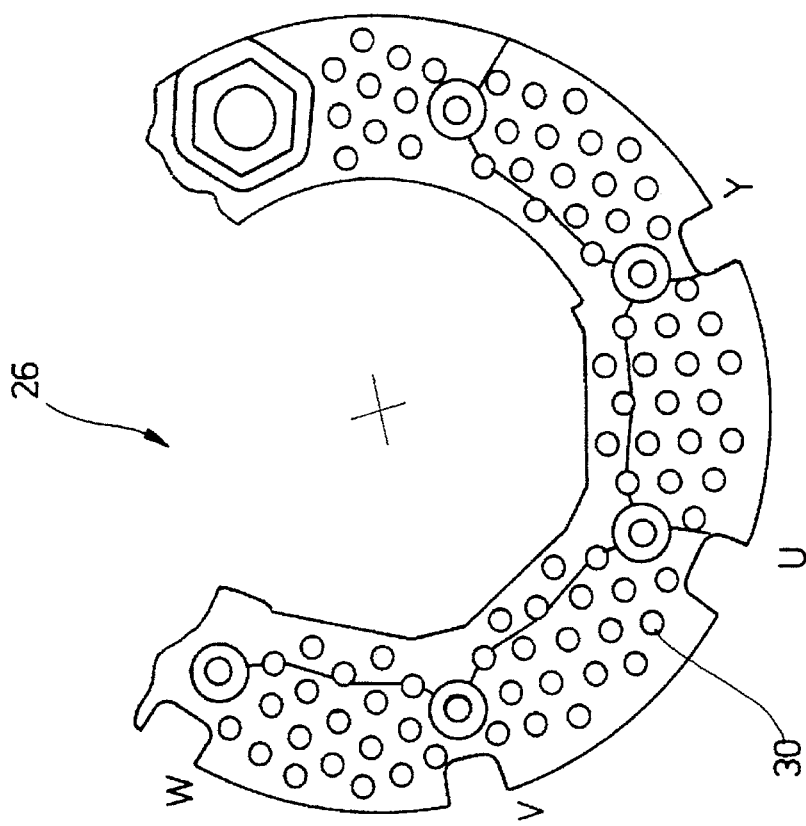
FIG. 7 (*a*) is a top view of a positive heat sink.
Figure 7A:
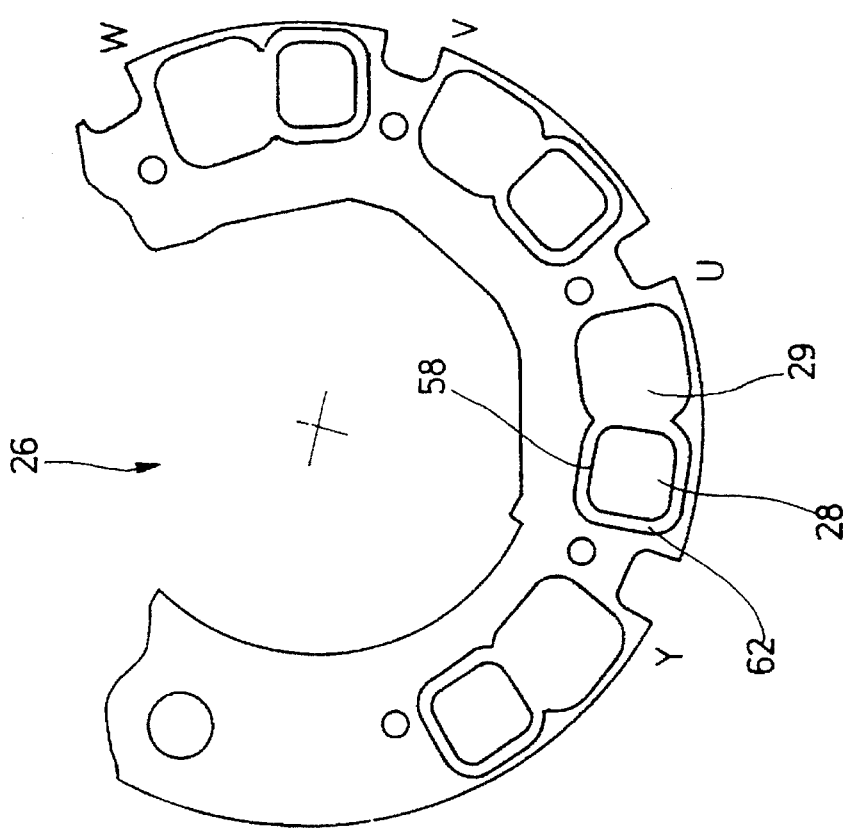

The positive heat sink 26 is shown in a plan view in FIG. 7a and in a rear view in FIG. 7b. The positive heat sink 26 has the same shape as the connection plate 32, i.e. the heat sink likewise extends in an annular fashion in accordance with the contour of a three-phase generator. The depressions 29 in the positive heat sink 26 which lead to the formation of the platform-like projection 28 become clear in the plan view. The cooling studs 30, which are arranged over the entire positive heat sink 26 and lead to an enlargement of the cooling surface of the positive heat sink 26 are seen in the rear view of FIG. 7b. The positive heat sink 26 forms additional cutouts (not to be considered here in more detail) for connecting elements or bushings of terminals of the three-phase generator.

Figure 8B:
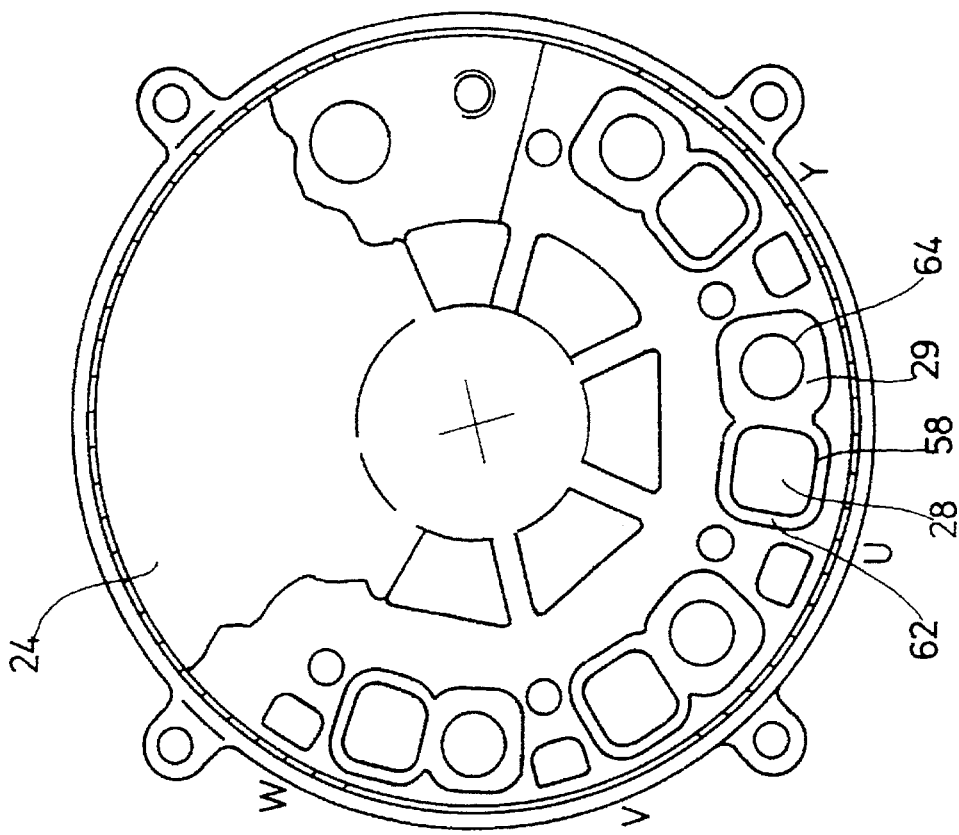
FIG. 8 (*a*) is a top view of a negative heat sink.
Figure 8A:
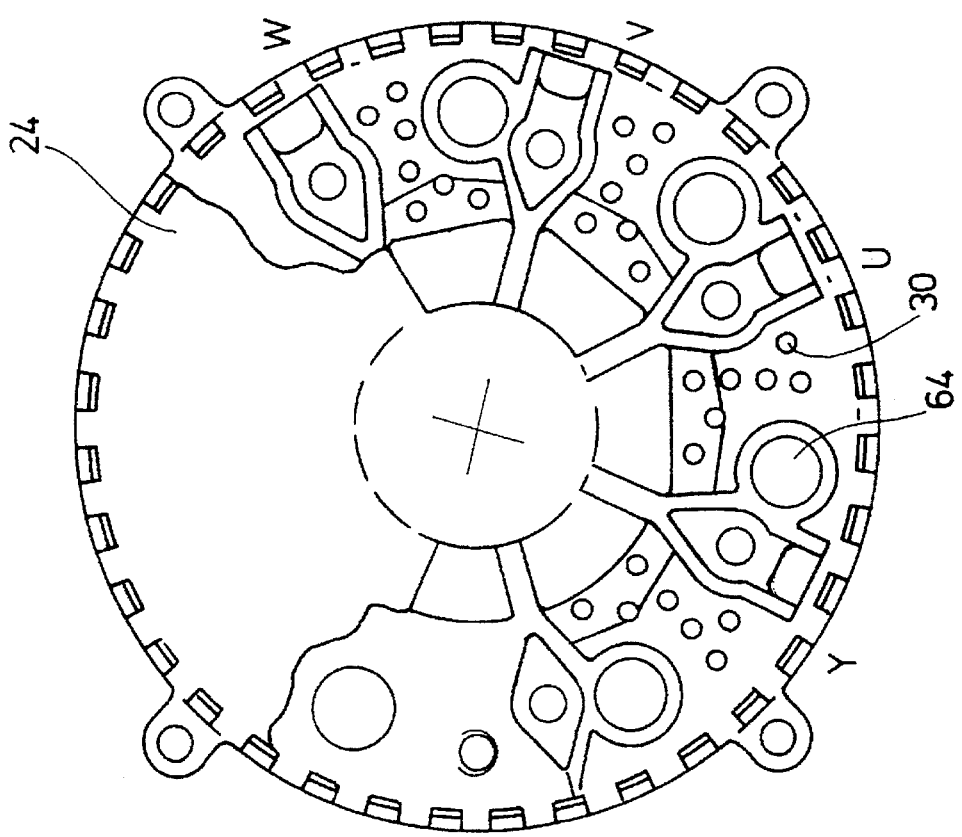

The negative heat sink 24 is represented in a plan view in FIG. 8a and in a rear view in FIG. 8b. The negative heat sink 24 can serve simultaneously as a slipring end shield of a three-phase generator, and has a circular shape adapted to the shape of the three-phase generator. The depressions 29 and 62 which lead to the formation of the projection 28 are shown in the rear view. Indicated here in the depression 29 is the opening 64 which permits access for assembly to the cavity 44 of the connection plate 32. There is no intention to provide further details of the negative heat sink 24 or the slipring end shield in this description.

Figure 9:
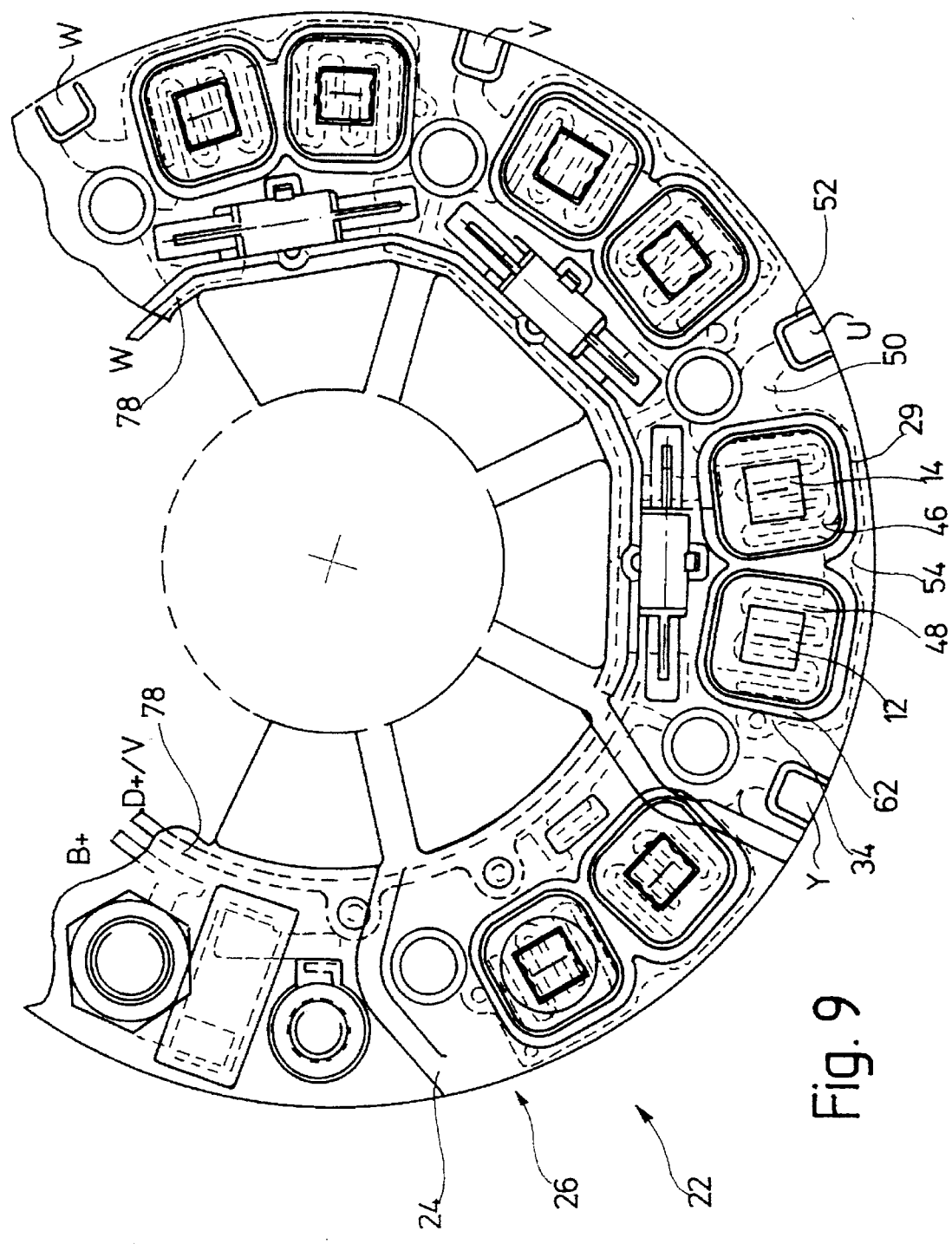
FIG. 9 is a view of a finally assembled rectifier arrangement in a see-through representation.

Finally, FIG. 9 shows an entire rectifier arrangement 22 in a plan view, the aim being to illustrate the sandwich-type design of the rectifier arrangement 22 by means of a see-through representation. Identical parts are provided, as in the preceding figures, with identical reference symbols and are not explained again here in connection with FIG. 9. A designation is performed here only with reference to the phase U, the design at the other phases W and V and at the star point Y of the rectifier arrangement 22 being identical. It becomes clear from the enlarged representation shown here that it is possible to embed additional conductor tracks 78 in the connection plate 32, which are suitable, for example, for separately tapping the phase W or the phase V, or the signals B+ and D+. The conductor tracks 78 are also taken into account in this case in the corresponding punched grids 34, with the result that the required electrical conducting paths are provided. Because of the structure of the rectifier arrangement 22 according to the invention, specifically to its sandwich-like design, composed of the negative heat sink 24, the connection plate 32 and the positive heat sink 26, the arrangement can be designed simply and very robustly, with the result that the rectifier arrangement 22 can be operated reliably and economically over its entire expected lifetime or over the lifetime of the three-phase generator. Because of the meandering design of the springs 46 and 48, on the one hand compensation of any possible manufacturing tolerances during the production of the heat sinks 24 and 26, respectively, and of the connection plate 32 is guaranteed. Moreover, mechanical, thermal and chemical fatigue of the rectifier arrangement 22 can be counteracted by the springs 46 and 48, respectively, embedded in a sealing compound.

While the invention has been illustrated and described as embodied in a rectifier arrangement, especially for a three-phase generator for a motor vehicle, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and desired to be protected by Letters Patent is set forth in the appended claims.

We claim:

1. A rectifier arrangement for a three-phase current having three phases (U, V, W), said rectifier arrangement comprising at least one power diode (12) of positive polarity and at least one power diode (14) of negative polarity assigned to respective half-waves of each of said three phases (U, V, W); a cooling arrangement including heat sinks (26, 24) of said at least one power diodes of positive and negative polarity, said at least one power diodes of like polarity being arranged on respective ones of said heat sinks (26, 24) in an electrically and thermally conductive manner; at least one electrically insulating part (32) assembled with the heat sinks (26, 24) and accommodating electrical connections between the at least one power diodes (12, 14) of positive and negative polarity and the three phases (U, V, W); a conductor track (50) of said at least one positive power diode (12) and said at least one negative power diode (14) of each of said three phases (U, V, W), each of said conductor tracks (50) extending in the at least one electrically insulating part (32) to one of the three phases (U, V, W) and spring elements making electrical contact outside the at least one electrically insulating part (32) with the respective at least one power diodes (12, 14) of positive polarity and negative polarity;

wherein the spring elements and the connected conductor track (50) for each of said phases (U, V, W) are each formed as part of a punched grid (34), each of said punched grids (34) is sheathed with an insulating material (36) by injection coating except at regions of each of said punched grid (34) including said spring elements and a terminal connection (52) for each of said phases (U, V, W), said insulating material (36) is part of the at least one electrically insulating part (32) and the at least one electrically insulating part (32) consists of said punched grid (34) and said insulating material (36), each of said punched grids (34) is injection coated with said insulating material (36); and wherein the at least one electrically insulating part (32) is arranged between one (26) of said heat sinks and another (24) of said heat sinks, in the region of the at least one power diodes (12, 14) of positive and negative polarity the at least one electrically insulating part (32) is provided with respective cutouts (38, 42) forming respective cavities (40, 44) bounded by said heat sinks (24, 26) and the at least one electrically insulating part (32) and the respective spring elements are arranged in said cavities (40, 44).

2. The rectifier arrangement as claimed in claim 1, wherein each of the spring elements is a meandering spring (46, 48).

3. The rectifier arrangement as claimed in claim 2, wherein each of said three phases (U, V, W) is assigned a pair of said meandering springs (46, 48) making electrical contact with respective ones of said at least one positive diode (12) and said at least one negative diode (14) of said phase.

4. The rectifier arrangement as claimed in claim 1, wherein the at least one electrically insulating part (32) has at least one slot (56) connected via at least one channel (58) in the heat sink (24, 26) to at least one of the cavities (40, 44).

5. The rectifier arrangement as claimed in claim 4, further comprising a sealing compound in the at least one slot (56) and the cavities (40, 44).

6. The rectifier arrangement as claimed in claim 5, wherein the portion of the sealing compound in the cavities (40, 44) includes embedded elastic regions.

7. The rectifier arrangement as claimed in claim 6, wherein said embedded elastic regions comprise air-filled balloons.

8. The rectifier arrangement as claimed in claim 6, wherein said embedded elastic regions are made of a foam.

9. The rectifier arrangement as claimed in claim 1, wherein each of the heat sinks (24, 26) is provided with a depression (62) and said at least one electrically insulating part (32) has webs (60) engaging at least partially in the depressions (62), each of said webs being arranged between one of said cavities (44, 40) and a slot (56) provided in said at least one electrically insulating part (32).

10. The rectifier arrangement as claimed in claim 1, for a three-phase generator of a motor vehicle.

11. A rectifier arrangement for a three-phase current having three phases (U, V, W), said rectifier arrangement comprising at least one power diode (12) of positive polarity and at least one power diode (14) of negative polarity assigned to respective half-waves of each of said three phases (U, V, W); a cooling arrangement including heat sinks (26, 24) of said at least one power diodes of positive and negative polarity, said at least one power diodes of like polarity being arranged on respective ones of said heat sinks (26, 24) in an electrically and thermally conductive manner; at least one electrically insulating part (32) assembled with the heat sinks (26, 24) and accommodating electrical connections between the at least one power diodes (12, 14) of positive and negative polarity and the three phases (U, V, W), and an electrically conductive connection (50) of said at least one positive power diode (12) and said at least one negative power diode (14) of each of said three phases (U, V, W), each of said electrically conductive connections (50) extending in the at least one electrically insulating part (32) to one of the three phases (U, V, W) and including meandering springs (46, 48) making electrical contact outside the at least one electrically insulating part (32) with the respective at least one power diodes (12, 14) of positive polarity and of negative polarity;

wherein the at least one electrically insulating part (32) is arranged between one (26) of said heat sinks and another (24) of said heat sinks and in the region of the at least one power diodes (12, 14) of positive and negative polarity the at least one electrically insulating part (32) is provided with respective cutouts (38, 42) forming respective cavities (40, 44) in which the respective meandering springs (46, 48) are arranged, wherein the at least one electrically insulating part (32) is arranged between one (26) of said heat sinks and another (24) of said heat sinks, in the region of the at least one power diodes (12, 14) of positive and negative polarity the at least one electrically insulating part (32) is provided with respective cutouts (38, 42) forming respective cavities (40, 44) bounded by said heat sinks (24, 26) and the at least one electrically insulating part (32) and the respective meandering springs (48, 46) are arranged in said cavities (40, 44); and wherein the at least one electrically insulating part (32) has at least one slot (56) connected via at least one channel (58) in the heat sink (24, 26) to at least one of the cavities (40, 44).

12. The rectifier arrangement as claimed in claim 11, further comprising a sealing compound in the at least one slot (56) and the cavities (40, 44).

13. A rectifier arrangement for a three-phase current having three phases (U, V, W), said rectifier arrangement comprising at least one power diode (12) of positive polarity and at least one power diode (14) of negative polarity assigned to respective half-waves of each of said three phases (U, V, W); a cooling arrangement including heat sinks (26, 24) of said at least one power diodes of positive and negative polarity, said at least one power diodes of like polarity being arranged on respective ones of said heat sinks (26, 24) in an electrically and thermally conductive manner; at least one electrically insulating part (32) assembled with the heat sinks (26, 24) and accommodating electrical connections between the at least one power diodes (12, 14) of positive and negative polarity and the three phases (U, V, W), and an electrically conductive connection (50) of said at least one positive power diode (12) and said at least one negative power diode (14) of each of said three phases (U, V, W), each of said electrically conductive connections (50) extending in the at least one electrically insulating part (32) to one of the three phases (U, V, W) and including meandering springs (46, 48) making electrical contact outside the at least one electrically insulating part (32) with the respective at least one power diodes (12, 14) of positive polarity and of negative polarity;

wherein the at least one electrically insulating part (32) is arranged between one (26) of said heat sinks and another (24) of said heat sinks so that in the region of the at least one power diodes (12, 14) of positive and negative polarity the at least one electrically insulating part (32) is provided with respective cutouts (38, 42) forming respective cavities (40, 44) in which the respective meandering springs (48, 46) are arranged; and wherein each of the heat sinks (24, 26) is provided with a depression (62) and said at least one electrically insulating part (32) has webs (60) engaging at least partially in the depressions (62), each of said webs being arranged between one of said cavities (44, 40) and a slot (56) provided in said at least one electrically insulating part (32).

14. The rectifier arrangement as claimed in claim 13, wherein said slot (56) is connected via a channel (58) in the heat sink (24, 26) to one of the cavities (40, 44).

15. The rectifier arrangement as claimed in claim 13, further comprising a sealing compound in said slot (56) and the cavities (40, 44).

* * * * *